United States Patent
Yang et al.

(10) Patent No.: US 8,552,426 B2
(45) Date of Patent: Oct. 8, 2013

(54) COMPOSITE DIELECTRIC MATERIAL DOPED WITH RARE EARTH METAL OXIDE AND MANUFACTURING METHOD THEREOF

(71) Applicant: National Sun Yat-Sen University, Kaohsiung (TW)

(72) Inventors: Hung-Duen Yang, Kaohsiung (TW); Sudip Mukherjee, Kaohsiung (TW); Ching-Hsuan Chen, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 13/848,038

(22) Filed: Mar. 20, 2013

(65) Prior Publication Data

US 2013/0221349 A1   Aug. 29, 2013

Related U.S. Application Data

(63) Continuation of application No. 13/075,162, filed on Mar. 29, 2011.

(30) Foreign Application Priority Data

Mar. 29, 2010   (TW) .............................. 99109435 A

(51) Int. Cl.
    *H01L 29/12*   (2006.01)
(52) U.S. Cl.
    USPC ............... 257/43; 257/E21.002; 257/E29.068
(58) Field of Classification Search
    USPC ............................ 257/43, E21.002, E29.068
    See application file for complete search history.

*Primary Examiner* — Marvin Payen
(74) *Attorney, Agent, or Firm* — Cheng-Ju Chiang

(57) ABSTRACT

A composite dielectric material doped with rare earth metal oxide and a manufacturing method thereof are provided. The composite dielectric material is doped with nano-crystalline rare metal oxide which is embedded in silicon dioxide glass matrix, and the composite dielectric material of the nano-crystalline rare metal oxide and the silicon dioxide glass matrix is synthesized by the manufacturing method using sol-gel route. The dielectric value of the glass composite dielectric material is greater than that of pure rare metal oxide or that of silicon dioxide. In presence of magnetic field, the dielectric value of the composite dielectric material is substantially enhanced compared with that of the composite dielectric material at zero field.

2 Claims, 13 Drawing Sheets

COMPOSITE DIELECTRIC MATERIAL DOPED WITH RARE EARTH METAL OXIDE AND MANUFACTURING METHOD THEREOF

CROSS REFERENCE TO RELATED APPLICATIONS

This application is a continuation application of U.S. patent application Ser. No. 13/075,162, filed on Mar. 29, 2011, the disclosure of which is incorporated herein by reference.

FIELD OF THE INVENTION

The present invention relates to a composite dielectric material and a manufacturing method thereof, and more particularly to a composite dielectric material doped with nanoparticles of rare earth metal oxide embedded in silicon dioxide showing colossal dielectric response and magnetodielectric effect and a manufacturing method thereof.

BACKGROUND OF THE INVENTION

Silicon (Si) element is a type of semiconductor material commonly used in electronic industries, and can be used as a substrate of a semiconductor wafer which thus can be deposited with various conductive material and dielectric material by semiconductor processes, wherein various deposited layers thereon are then patterned by suitable photomask exposure and development processes, so as to construct multilayer patterned integrated circuit (IC) structures. After forming the IC structures, the semiconductor wafer can be cut into a plurality of chips for being used as active control elements of various electronic products.

For a dielectric layer of the semiconductor wafer, the most common dielectric material is silicon dioxide (silica, $SiO_2$), silicon nitride ($Si_3N_4$), silicon oxynitride (SiON) and etc. However, with the line-width miniaturization of IC processes (such as 0.13 μm processes), a dielectric layer of $SiO_2$ with too smaller thickness will cause the phenomenon of electronic breakdown accompanied with very large static leakage power due to direct tunneling, wherein the direct tunneling leakage current seriously affects the power consumption of circuit elements which thus lose normal operation functions thereof (such as a memory storage function). Thus, when the thickness of a $SiO_2$ dielectric layer of a gate is designed to be smaller than 10 nm, the manufacturer uses high-k material to replace traditional $SiO_2$ material for solving the serious phenomenon of direct tunneling leakage current. Under the same thickness of $SiO_2$, the high-k material can substantially provide a greater physical thickness to solving the technical problem of direct tunneling leakage current.

The common high-k material comprises $Al_2O_3$, $HfO_2$, $ZrO_2$, $TiO_2$, $La_2O_3$, $Pr_2O_3$ or mixture thereof. The foregoing high-k material can be applied to gate dielectric layers in ICs. For example, the gate dielectric layers are important structural layers of metal oxide semiconductor field effect transistors (MOSFETs). Under the same thickness of $SiO_2$, the quantum tunneling can be up to 1.5 to 2.5 nm. For increasing the speed of circuit elements and lowering the threshold voltage thereof, the thickness of the gate dielectric layers need to be continuously lowered. If the gate dielectric layers are thinner, the desire of the gate dielectric layers is stricter, i.e. it needs to use the foregoing high-k material to provide a lower leakage current or higher breakdown field.

Generally, the foregoing dielectric material or high-k material is processed by heating silicon substrate, chemical vapor deposition (CVD) or DC magnetron sputtering system to obtain an oxide layer of $SiO_2$ or a high-k coating. However, syntheses and crystallo-chemistries of the foregoing perovskite type compounds are too complicated, while the stability of pure phase thereof, the precise control of composite and oxygen stoichiometry are also very difficult. Therefore, it needs to use amorphous high-k oxide candidates with superior phase stability for designing and assembling multifunctional devices that operate at higher temperatures. In addition, the superior electronic performance of Si in particular the Si surface that is realized with an $SiO_2$ overlayer, the Si—$SiO_2$ interface, has not been achieved with any other semiconductor-dielectric combination to this day. $SiO_2$ effected a seemingly magical improvement in the electrical characteristics of the Si surface compatible with planarization technology. Future CMOS generations may be enhanced by nanocrystalline high-k dielectrics, and added functionality and flexibility may be achieved through oxide/silicon/oxide heterostructures for quantum-effect devices.

Recently, there has been a trend of development of magnetic nanoparticle in nonmagnetic dielectric matrix to tailor desired magnetic, dielectric, and other properties depending on the concentration of the magnetic ions. However, these types of perovskites possess compositional variations, structural inhomogeneities, or phase heterogeneities in physical scale from micron or submicron range to the atomic level. This suggests that the high-k value and MD behavior of aforementioned complex system is not a fundamental property but is rather an artifact associated with mesoscopic heterogeneities of the system. Therefore, searching for alternative materials containing single-valent ions with phase stability would be highly desirable.

As a result, it is necessary to provide a semiconductor wafer having dielectric layers showing colossal magnetodielectric effect and a manufacturing method thereof to solve the problems existing in the conventional technologies, as described above.

It is found by the present invention that magnetic rare earth oxides ($RE_2O_3$, RE means lanthanoids, i.e. a series of 10 elements from La to Lu in the periodic table) can be embedded into $SiO_2$ glass matrix to form composite of super-paramagnetic nanoparticles showing colossal magnetodielectric (MD) effect, wherein the colossal MD behavior in this glassy system is related to the magnetic spin and the dipole coupling through the lattice, so as to be able to develop magnetoresistance change effects associated with nanoparticles size and concentration.

SUMMARY OF THE INVENTION

A primary object of the present invention is to provide a composite dielectric material doped with nanoparticles of rare earth metal oxide embedded in silicon dioxide showing colossal dielectric response and magnetodielectric effect and a manufacturing method thereof, wherein nanoparticles of rare earth oxides ($RE_2O_3$, RE means lanthanoids, i.e. a series of 10 elements from La to Lu in the periodic table) can be embedded into $SiO_2$ glass matrix by using sol-gel route, so as to form a glass composite system used as composite dielectric material which is also applied to a dielectric layer of a semiconductor wafer. The composite dielectric material can show colossal dielectric response and magnetodielectric effect under an externally applied magnetic field, so that it can increase the dielectric coefficient of the dielectric layer of the semiconductor wafer and lower the leakage current and power consumption thereof. As a result, it is advantageous to develop a multifunctional integrated circuit which can normally operate at room temperature or higher temperature.

To achieve the above object, the present invention provides a composite dielectric material doped with nanoparticles of rare earth metal oxide embedded in silicon dioxide showing colossal dielectric response and magnetodielectric effect, which comprises a matrix and a plurality of nanoparticles, wherein the matrix comprises silicon dioxide ($SiO_2$), the nanoparticles comprise at least one type of rare earth metal oxide, and the particle diameter of the nanoparticles is ranged from 2 nm to 10 nm.

In one embodiment of the present invention, the rare earth metal oxide is selected from erbium oxide ($Er_2O_3$), europium oxide ($Eu_2O_3$) or the mixture thereof.

In one embodiment of the present invention, the composite dielectric material is applied to a dielectric layer of a semiconductor wafer, wherein the wafer has a surface and the dielectric layer is formed on the surface of the wafer, the dielectric layer comprises a glass composite of the rare earth metal oxide and silicon dioxide of the nanoparticles in the composite dielectric material.

In one embodiment of the present invention, the surface of the wafer has at least two electrode layers, and the dielectric layer is disposed between the electrode layers.

In one embodiment of the present invention, the surface of the wafer has a plurality of electronic elements which pass through the dielectric layer to be electrically connected the at least two electrode layers with each other.

In one embodiment of the present invention, the nanoparticles are a glass composite of the rare earth metal oxide and silicon dioxide different from the silicon dioxide of the matrix.

On the other hand, the present invention provides a manufacturing method of composite dielectric material doped with nanoparticles of rare earth metal oxide embedded in silicon dioxide showing colossal dielectric response and magnetodielectric effect, which comprises steps of: mixing tetraethylorthosilicate (TEOS) and at least one type of rare earth metal chloride into a silica gel; and processing the silica gel by calcination to reach a predetermined calcination temperature ranged from 700° C. to 1200° C., so that the silica gel is converted into nanoparticles of a glass composite of rare earth metal oxide and silicon dioxide to thus form a composite dielectric material having the rare earth metal oxide, wherein the particle diameter of the nanoparticles is ranged from 2 nm to 10 nm.

In one embodiment of the present invention, the rare earth metal is selected from erbium (Er), europium (Eu) or the mixture thereof.

In one embodiment of the present invention, the composite dielectric material is applied to a surface of a semiconductor wafer to form a dielectric layer, and the dielectric layer comprises the glass composite of the rare earth metal oxide and the silicon dioxide of the composite dielectric material.

In one embodiment of the present invention, the concentration of the rare earth metal chloride doped in the TEOS is ranged from 0.1 mole % to 1.0 mol %, such as 0.5 mol %.

In one embodiment of the present invention, the concentration of the nanoparticles of the rare earth metal oxide doped in the silicon dioxide is ranged from 0.1 mole % to 1.0 mol %, such as 0.5 mol %.

In one embodiment of the present invention, before processing the silica gel by calcination, keeping stationary to dry the silica gel of the TEOS and the rare earth metal chloride.

In one embodiment of the present invention, when processing the silica gel by calcination, the silica gel of the TEOS and the rare earth metal chloride is processed by multi-step calcinations to form the composite dielectric material doped with the nanoparticles of the rare earth metal oxide embedded in the silicon dioxide.

In one embodiment of the present invention, after forming the composite dielectric material, further comprising: mixing the glass composite of the rare earth metal oxide and the silicon dioxide with TEOS in another sol-gel process to obtain a mixture solution; applying the mixture solution onto a surface of a semiconductor wafer by spin coating to form a silica gel layer; and processing the silica gel layer by calcination, so as to form a dielectric layer having the glass composite of the rare earth metal oxide and the silicon dioxide and a silica matrix, wherein the silicon dioxide of the silica matrix is different from the silicon dioxide of the nanoparticles of the glass composite.

DETAILED DESCRIPTION OF THE PREFERRED EMBODIMENTS

Figure 1A:
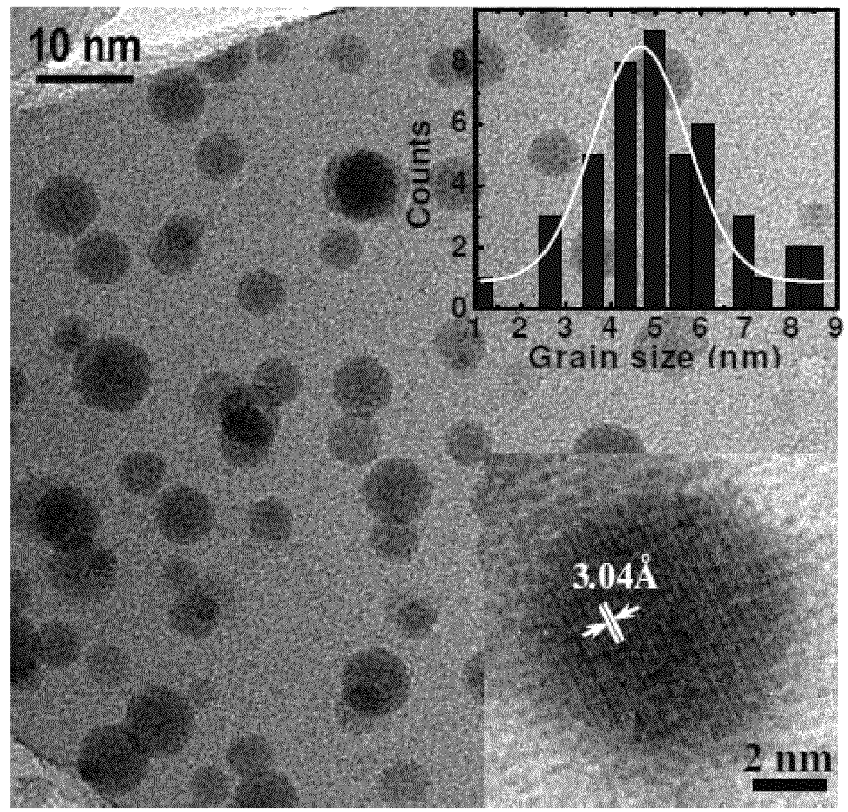
FIG. 1(a) is a TEM microscopic image of an Er05-8 sample according to a preferred embodiment of the present invention, wherein an upper right inset figure is a particle size distribution histogram of the sample; and a lower right inset figure is a HRTEM (high resolution TEM) microscopic image of the sample.

The structure and the technical means adopted by the present invention to achieve the above and other objects can be best understood by referring to the following detailed description of the preferred embodiments and the accompanying drawings.

In the present invention, super-paramagnetic nanoparticles of rare earth metal oxides (such as erbium oxide $Er_2O_3$ or europium oxide $Eu_2O_3$) are evenly embedded into a silica ($SiO_2$) glass matrix to form a composite dielectric material showing colossal magnetodielectric (MD) effect, wherein the composite dielectric material can be applied to a dielectric layer of a semiconductor wafer. This colossal MD behavior in this glassy system is related to the magnetic spin and the dipole coupling through the lattice, so as to be able to develop magnetoresistance change effects associated with nanoparticles size and concentration. For example, a sol-gel technique can be used to cause the growth of $Er_2O_3$ magnetic oxides in inorganic silica matrix. Among various rare earth oxides, $Er_2O_3$ has the highest MD effect, the highest resistivity ($10^{12}$-$10^{13}$ cm$^{-3}$), a larger band gap ($E_g$=5-7 eV), a static dielectric constant value (k) about 14, good thermodynamic stability with silicon and etc. The sol-gel process can provide a convenient way for designing rare earth metal oxide nanoparticles with nearly uniform sizes and homogeneous dispersion in the silica matrix. Thus, the present invention will describe the sol-gel process used for the preparation of rare earth metal oxide nanoparticles in $SiO_2$ matrix more detailed hereinafter.

The present invention will provide a preferred embodiment hereinafter, wherein the erbium oxide $Er_2O_3$ is exemplified to explain the technical concept of the present invention. In the preferred embodiment of the present invention, a composite system of erbium oxide and silica glass showing colossal magnetodielectric behavior can be synthesized at room temperature under atmospheric condition by a simple and economic single-step process. Firstly, a silica gel doped with erbium oxide is prepared by tetraethylorthosilicate (TEOS, i.e. $Si(OC_2H_5)_4$) and the dopant of erbium chloride ($ErCl_3$), wherein the dopant concentration of erbium chloride is preferably ranged from 0.5 mol %, and the remaining is 99.5 mol % silica ($SiO_2$); and wherein erbium chloride will be converted into erbium oxide after being treated at high temperature by the following calcination. The manufacturing method of the present invention is based on a hydrolysis of precursors (TEOS), a water condensation of hydrolyzed TEOS and an alcoholic condensation thereof, wherein the foregoing reactions are carried out in a medium containing a hydro-alcoholic solution of erbium salt and are listed, as follows:

Hydrolysis of TEOS:

Water Condensation:

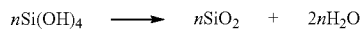

Alcoholic Condensation:

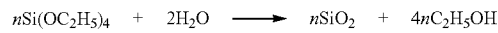

After finishing the sol-gel step, the composite of erbium oxide and silica glass of the present invention is dried at room temperature about 3 to 6 weeks, so as to obtain a monolithic transparent gel sample. Then, the room temperature is gradually raised to a high temperature to process the composite of erbium oxide and silica glass is calcined (i.e. annealed) by multi-step calcinations, to reach different predetermined maximum calcination temperatures (700° C., 800° C., 900° C. and 1200° C.), as shown in the following temperature raising flowchart, wherein temperature raising speed (° C./min) and duration (hours) of each of temperature raising steps is different from each other, but the difference value is not limited thereto. The silica gels doped with erbium calcined by the three different maximum calcination temperatures are also called Er05-7, Er05-8 and Er05-12 in turn hereinafter, wherein the Er05-7, Er05-8, Er05-9 and Er05-12 represent that three embodiments of composite samples of erbium oxide and silica glass having 0.5 mol % $Er_2O_3$ are prepared under different predetermined maximum calcination temperatures (700° C., 800° C., 900° C. and 1200° C.) in turn.

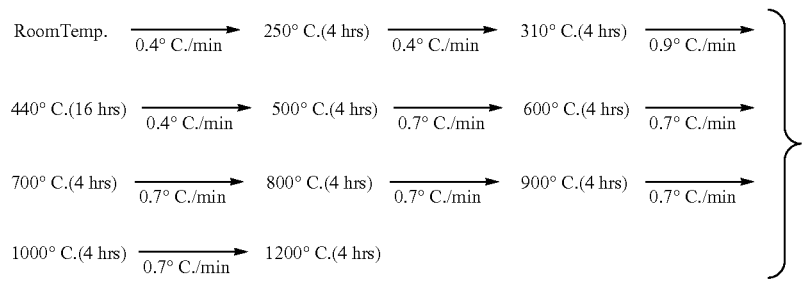

When the silica gels doped with erbium and prepared by the sol-gel route are calcined at about 400° C., the silica gels doped with erbium will become porous, and the pores thereof start to collapse at about 700° C. With raising the temperature, the functional group "≡Si—OH" will be condensed into "≡Si—O—Si≡", so as to enhance the collapse of the pores, wherein ions of the rare earth metal oxide are only loosely attached to the vicinity of the pores. The nano-scale dimensions of the clusters reside of the rare earth metal oxide depend upon the annealing temperature thereof. For example, at a higher temperature (such as 800° C.), collapse of larger pores will take place, while more Er-ions are agglomerated to form nanoparticles with greater size. Thus, at a further higher temperature (such as 1200° C.), $Er_2O_3$ nanoparticles in the silica matrix will grow into a further greater size. After finishing the multi-step calcination, irregular mass of composite of erbium oxide and silica glass can be obtained.

To understand properties of the silica gel samples doped with erbium, powder XRD of the samples is performed by using Cuκ radiation. An ultra high resolution TEM (HRTEM, Model: JEM-3010, JEOL) is used to analyze the detailed structure of the Er05-7 and Er05-8 samples. Optical absorption spectra were carried out by using a UV-visible spectrometer (Model: 2101 PC, Shimadzu) within the 200-900 nm region. The magnetic hysteresis measurements were performed in a SQUID magnetometer (Model: MPMS-XL, Quantum Design) with temperatures varying from 2 to 300 K, equipped with a superconducting magnet producing fields up to ±6T. The MD measurements were carried out with a LCR meter (Model No. E4980A, Agilant) in conjunction with a cryostatic arrangement integrated to the physical properties measurement system (PPMS) (Model: 6000, Quantum Design) configured up to 9 tesla (T) magnetic field. Ferroelectric loop measurement was carried out by using a Precision LC meter (Model: 609E-6, Radiant Technologies). The present invention concentrates the variations in temperature and frequency dependent MD properties mainly on the Er05-8 sample for clarity and compare the analysis with Er05-7, Er05-9, and Er05-12 hereinafter.

Figure 1B:
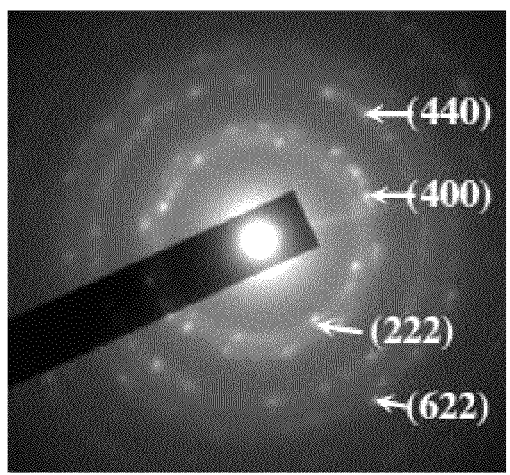
FIG. 1(b) is a selected-area electron-diffraction (SAED) pattern of the sample according to the preferred embodiment of the present invention.

Firstly, properties of the erbium-doped silica gel sample measured by TEM, XRD and SQUID are described, as follows: Referring now to FIG. 1(a), the TEM image of the powder specimen of the Er05-8 sample shows nearly spherical nanoparticles of $Er_2O_3$ in the particle size range of about 3-6 nm present in the glass matrix. As shown in the upper right inset figure of FIG. 1(a), the particle size distributions histogram of the sample is illustrated. As shown in the lower right inset figure of FIG. 1(a), a HRTEM (high resolution TEM) microscopic image of the sample ($Er_2O_3$ nanoparticles) is illustrated, and shows clear lattice fringes with interplanar spacing (3.05 Å) which agrees with the d spacing confirming the presence of nanocrystalline phase. Referring now to FIG. 1(b), the selected-area electron-diffraction (SAED) pattern of the sample shows spotted ring patterns suggesting the development of regions of localized crystallinity.

Figure 1C:
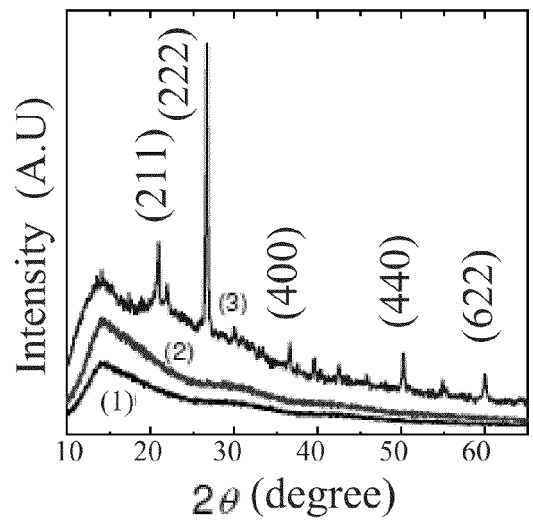
FIG. 1(c) is a curve diagram of XRD patterns of Er05-7, Er05-8 and Er05-12 samples according to the preferred embodiment of the present invention.

Referring now to FIG. 1(c), the curve diagram of XRD patterns of the high temperature annealed system Er05-12 sample (3) is illustrated, wherein the XRD patterns of the Er05-12 sample is crystalline with quite large $Er_2O_3$ nanoparticles (>40 nm) which thus clearly exhibits the most intense characteristic line corresponding to the single phase $Er_2O_3$ at 2θ about 29.30° (peak value: 222). Applying the well-known Scherrer's equation, sizes of Er-oxide nanoparticles (Er05-12) are also estimated from the integral breadths of the lines as shown in Table 1. The XRD patterns of Er05-7 and Er05-8 samples cannot be well resolved due to their amorphouslike character. Only a very feeble broad peak can be traced with great difficulty in the XRD domain, 2θ=10°–65°. It is confirmed that the sizes of $Er_2O_3$ nanoparticles embedded in the silica glass matrix grow larger for samples calcined at higher temperatures.

TABLE 1

Powder XRD and TEM structural data, dielectric coefficient (k), phase transition temperature, and other parameters of the magnetodielectric glass composite system of $Er_2O_3$:$SiO_2$:

| Sample | Interplanar intercept (h k l) | Particle size [nm] (from XRD) | Particle size [nm] (from TEM) | Magnetic field Intensity H (Tesla) | Max dielectric value $\epsilon_{max}$ | Temp of Max dielectric value $T_{max}$ (K) | Curie-Weiss fitting parameters Curie-Weiss Temp $T_o$ (K) | Curie-Weiss Constant C (K) |
|---|---|---|---|---|---|---|---|---|
| Er05-7 | — | Predominantly amorphous | ≈2 | 0 | 369 | 255 | — | — |
|  |  |  |  | 5 | 571 | 255 |  |  |
|  |  |  |  | 9 | 763 | 260 |  |  |

TABLE 1-continued

Powder XRD and TEM structural data, dielectric coefficient (k), phase transition temperature, and other parameters of the magnetodielectric glass composite system of $Er_2O_3:SiO_2$:

| Sample | Interplanar intercept (h k l) | Particle size [nm] (from XRD) | Particle size [nm] (from TEM) | Magnetic field Intensity H (Tesla) | Max dielectric value $\epsilon_{max}$ | Temp of Max dielectric value $T_{max}$ (K) | Curie-Weiss Temp $T_o$ (K) | Curie-Weiss Constant C (K) |
|---|---|---|---|---|---|---|---|---|
| Er05-8 | — | Predominantly amorphous | ≈5 | 0 | 284 | 270 | 260.06 | 3968.82 |
|  |  |  |  | 5 | 570 | 280 | 270.12 | 6211.29 |
|  |  |  |  | 9 | 724 | 280 | 271.64 | 6918.04 |
| Er05-12 | (2 1 1), (2 2 2), (4 0 0), (4 4 0), (6 2 2) | >40 | — | 0 | — | — | — | — |

Figure 2:
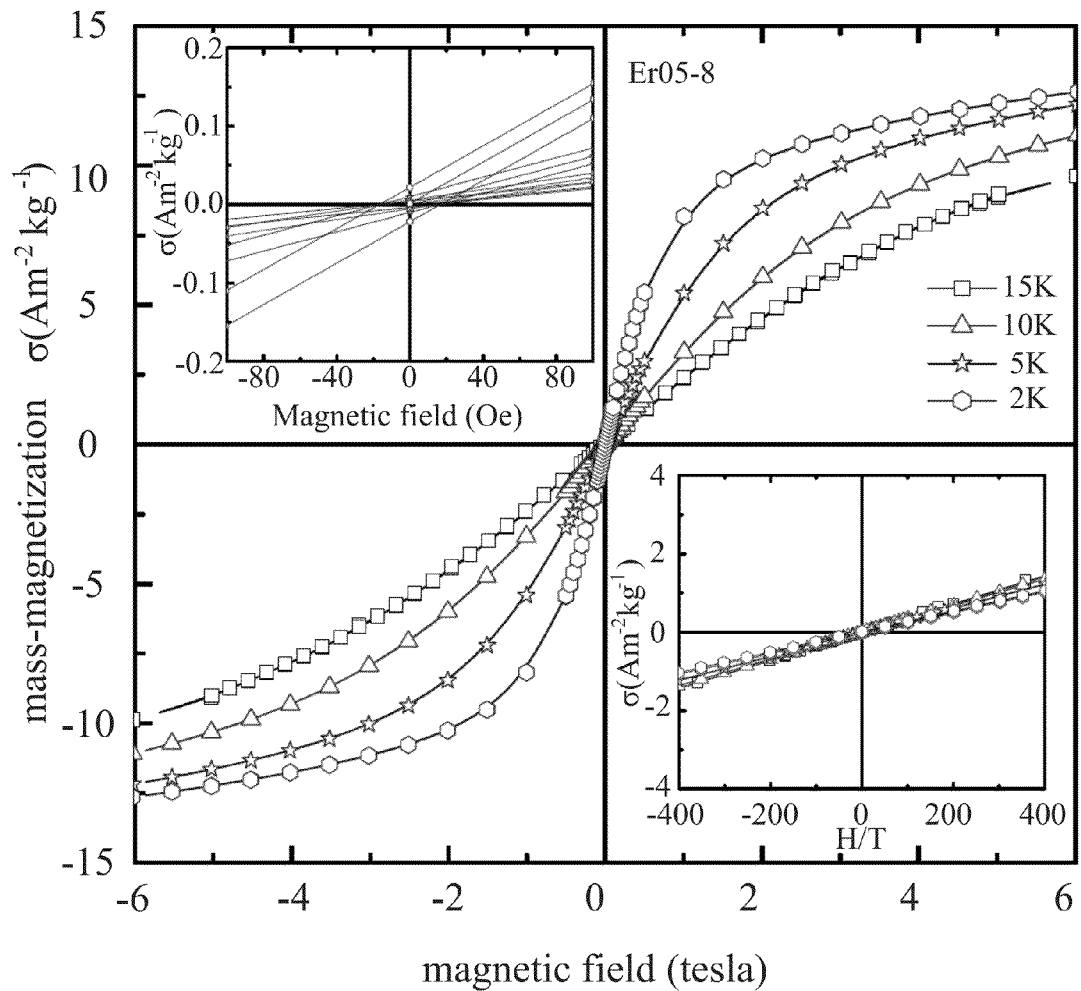
FIG. 2 is a magnetic hysteresis diagram of the Er05-8 sample recorded at different temperatures according to the preferred embodiment of the present invention, wherein an upper left inset figure is an enlarged relationship diagram of mass-magnetization (σ) vs. magnetic field (H) in a region close to the coercive field value, and a lower right inset figure is a relationship diagram of mass-magnetization (σ) vs. magnetic field/temperature (H/T) at different temperatures.

The magnetic-field (H) dependence of the magnetization of the Er05-8 sample is carried out in the magnetic field range of ±6 tesla and at different temperatures. Referring now to FIG. 2, the magnetization loop (zero area) obtained up to 5 K displays characteristics of superparamagnetism. Moreover, as shown in the lower right inset figure of FIG. 2, the relationship of mass-magnetization ($\sigma$) vs magnetic field/temperature (H/T) at different temperatures is linear and collapses to a single curve indicating the presence of superparamagnetic phase of $Er_2O_3$ nanoparticles (NPs) embedded in $SiO_2$ glass matrix. At the temperature 2 K, hysteretic behaviors are observed and the coercive field is found to have a non-zero value ($H_c$=0.020 tesla). It means that the NPs are going to be the magnetically ordered state at 2 K. As shown in the upper left inset figure of FIG. 2, an enlarged relationship diagram of mass-magnetization ($\sigma$) vs. magnetic field (H) in a nearly central region is illustrated, wherein it is evident from the bulging of the hysteresis loop near the central region and also the magnetic moment/unit mass is enhanced compared to other measuring temperature. The hysteresis curves of FIG. 2 do not show any magnetic saturation in the magnetic field range of ±6 tesla, from which it is inferred that the $Er_2O_3$ NPs contained in the samples possess large an isotropic fields.

Figure 3A:
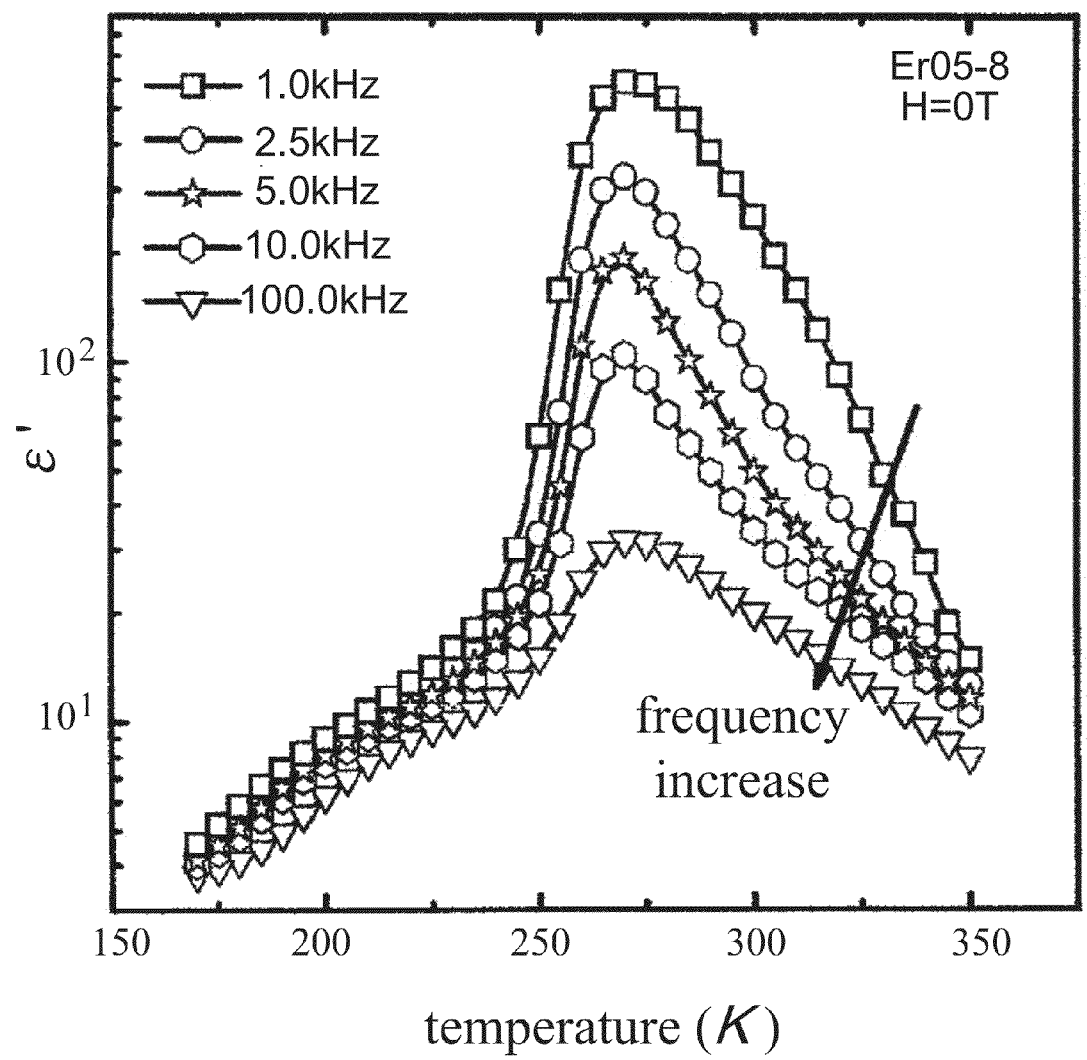
FIG. 3(a) is a relationship diagram of the dielectric value ($\in'$) and the absolute temperature (T) of the Er05-8 sample at different frequencies according to a preferred embodiment of the present invention.

Then, for dielectric spectroscopy, referring now to FIG. 3(a), the temperature dependence of the real part of the relative dielectric constant ($\in'$) of the Er05-8 sample in absence of magnetic field at several frequencies (2.5 kHz to 100 kHz), logarithmically separated by one decade, is illustrated, wherein the shape of the curves has a well defined maximum dielectric value ($\in'_m$) at $T_m$ about 270° K, and the frequency dependence indicates the phenomenon of dielectric relaxation. However, a notable broadening around the maximum dielectric value ($\in'_m$) is indicative of a diffuse phase transition (DPT) presence with high dielectric constant ($\in'$), quite different and much higher from pure bulk $Er_2O_3$. From DPT theory, in order to characterize the phase transition, the empirical expression can be used, as follows:

$$\in^{-1} - \in_m'^{-1} = C_i(T-T_m)^\gamma$$

wherein $\gamma$ is the diffuseness exponent indicative of degree of disorder; $C_i$ is a temperature independent co-efficient (in general, dependent of frequency); and $\in'_m$ is the maximum value of dielectric constant ($\in'$) at $T_m$. For $\gamma=1$, there is a normal Curie-Weiss behavior; and for $\gamma=$about 2, it implies a typical DPT for the ideal ferroelectric relaxor.

Figure 3B:
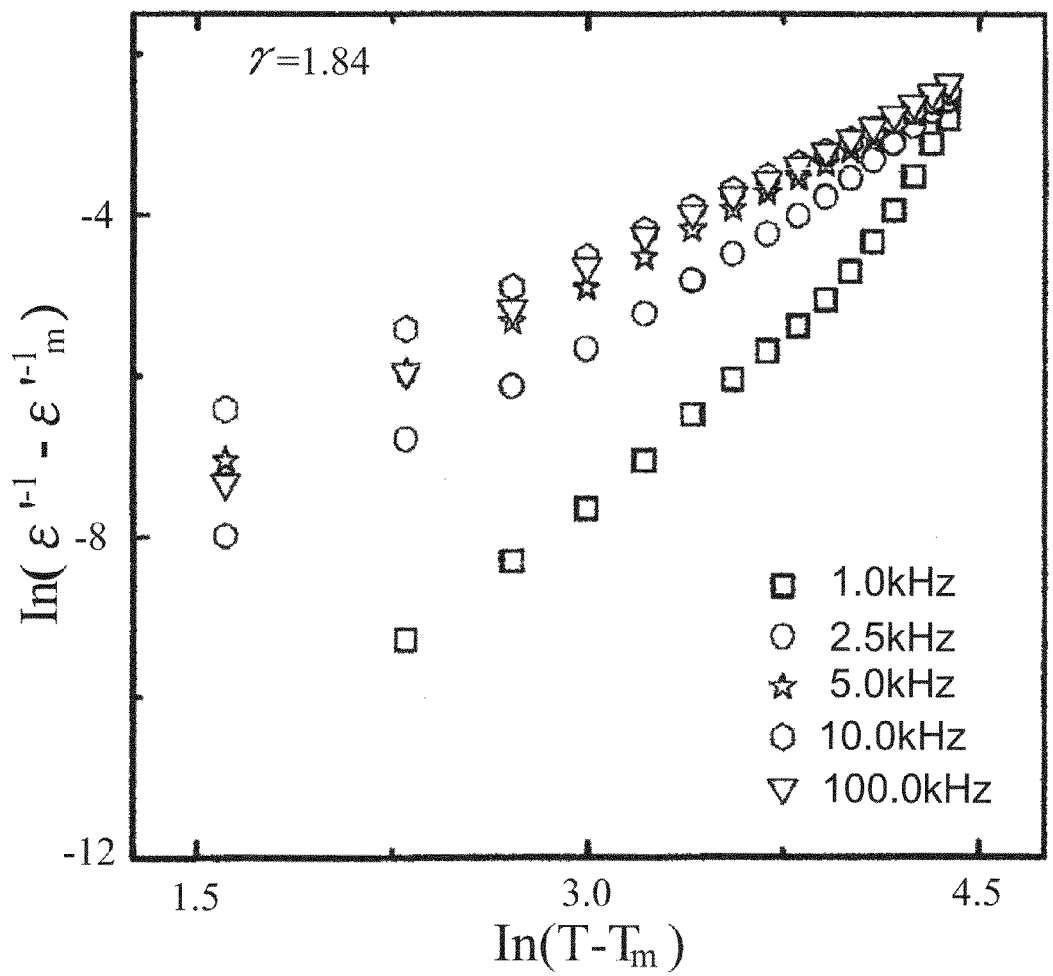
FIG. 3(b) is a relationship diagram of $\ln(\in'^{-1} - \in'^{-1}_m)$ vs $\ln(T-T_m)$ at temperatures higher than the absolute temperature ($T_m$) for the Er05-8 sample at different frequency values according to the preferred embodiment of the present invention.
Figure 3C:
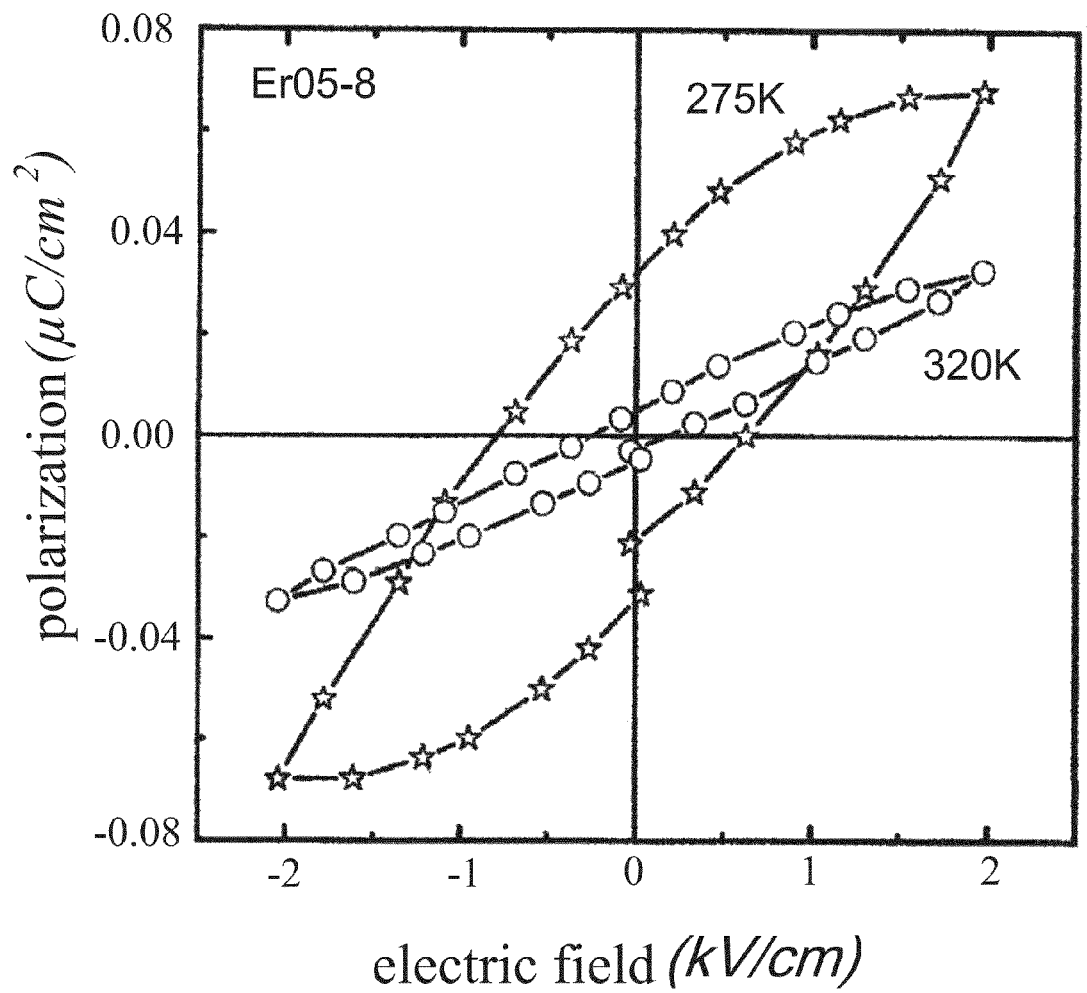
FIG. 3(c) is a curve diagram of a dielectric hysteresis loop showing FEL behavior according to the preferred embodiment of the present invention.

Referring now to FIG. 3(b), a relationship diagram of $\ln(\in^{-1}-\in'_m{}^{-1})$ vs $\ln(T-T_m)$ at temperatures higher than the absolute temperature ($T_m$) for the Er05-8 sample at different frequency values, wherein a linear fitting for the Er05-8 sample can obtain that $\gamma=1.84$, which is close to the relaxor value. Any space-charge or interfacial polarization is not responsible the enhancement of dielectric constant below $T_m$. referring now to FIG. 3(c), it should be noted that the temperature and frequency dependent dielectric constant ($\in'$) of the corresponding higher temperature calcined Er05-12 sample does not show this DPT behavior, but is similar to pure bulk $Er_2O_3$ and unlike other two lower calcined samples. This indicates that DPT character disappears with growing crystalline $Er_2O_3$ clusters (i.e. with increasing calcination temperature of the prepared sol-gel glass). The critical calcinations temperature above which DPT behavior completely diminishes for this typical concentration of $Er_2O_3$ (about 0.5 mol %) is found to be around 1000° C. The DPT behavior is thus confined to the low temperature calcined system (<1000° C., such as between 700° C. and 1000° C.) only where the nanoparticles are in the 2-10 nm range and the system is in the superparamagnetic phase.

Figure 3D:
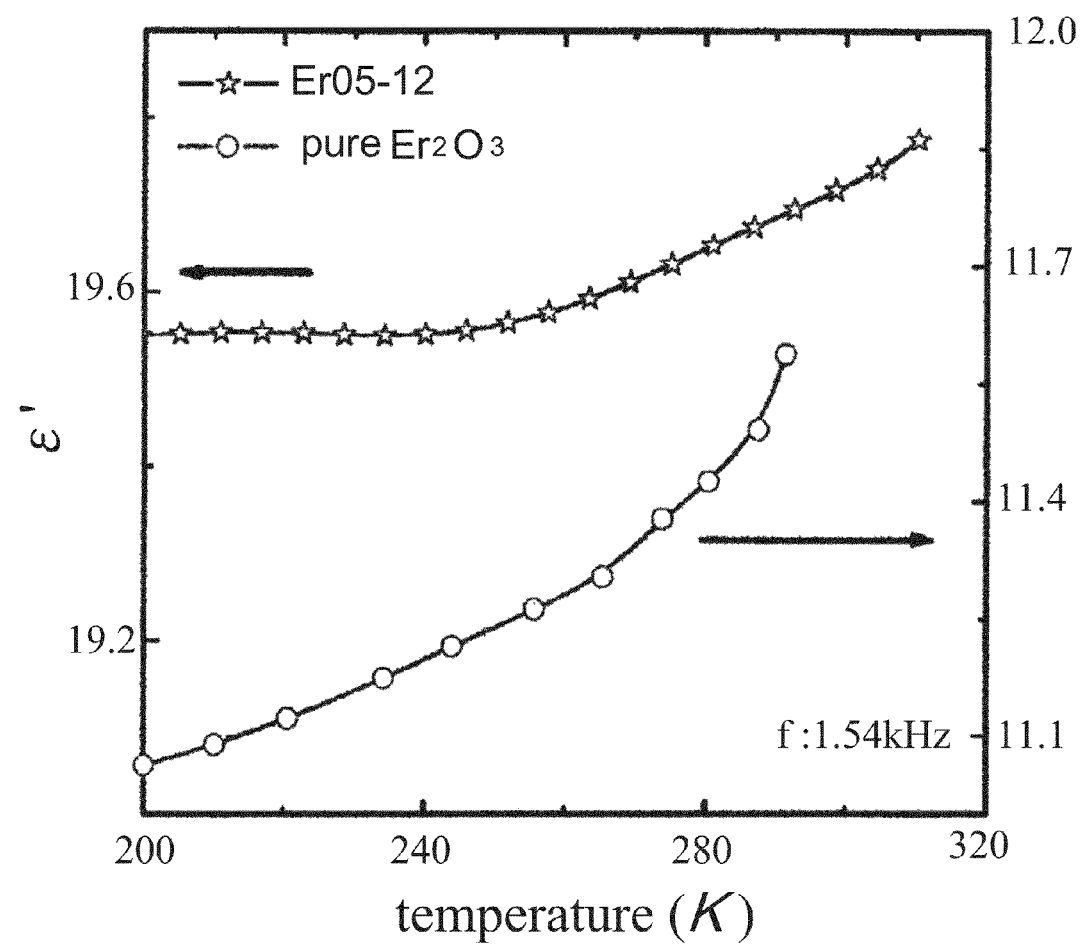
FIG. 3(d) is a relationship diagram of the dielectric value ($\in'$) and the absolute temperature (T) of the Er05-12 sample and pure bulk $Er_2O_3$ material according to the preferred embodiment of the present invention, indicating similar non-FEL feature.

Referring now to FIG. 3(d), to check the possible ferroelectric correlation, hysteresis loop is also observed, which represents a polarization cycle using higher polarization frequency (2000 Hz) and applied electric field up to ±2.0 kV/cm, wherein remnant polarization value (Pr) is about 0.032 $\mu C/cm^2$, and coercive field (Ec) is about 0.78 kV/cm at 275 K. The relatively narrow polarization electric field (P-E) loop without saturation demonstrates a non-canonical FEL behavior. The hysteresis loops are very spurious artifact that resemble true ferroelectric, and look very much like those of a lossy dielectric. In this nanoparticle-glass composite system (0.5 mol % $Er_2O_3$: 99.5 mol % $SiO_2$), the concentration of $Er_2O_3$ nanocrystalline is very small. Moreover, the polarization-electric field characteristics are studied using higher polarization frequency (2000 Hz), wherein the maximum frequency limit is due to the used instrument (Precision LC meter, Radiant Technologies). The high frequency hysteresis loop will be more closely related to the intrinsic ferroelectric switching processes than the low frequency counterpart, while the results of hysteresis loop indicates that temperature decreasing suggests ferroelectric-like ordering in the Er05-8 sample.

Figure 3E:
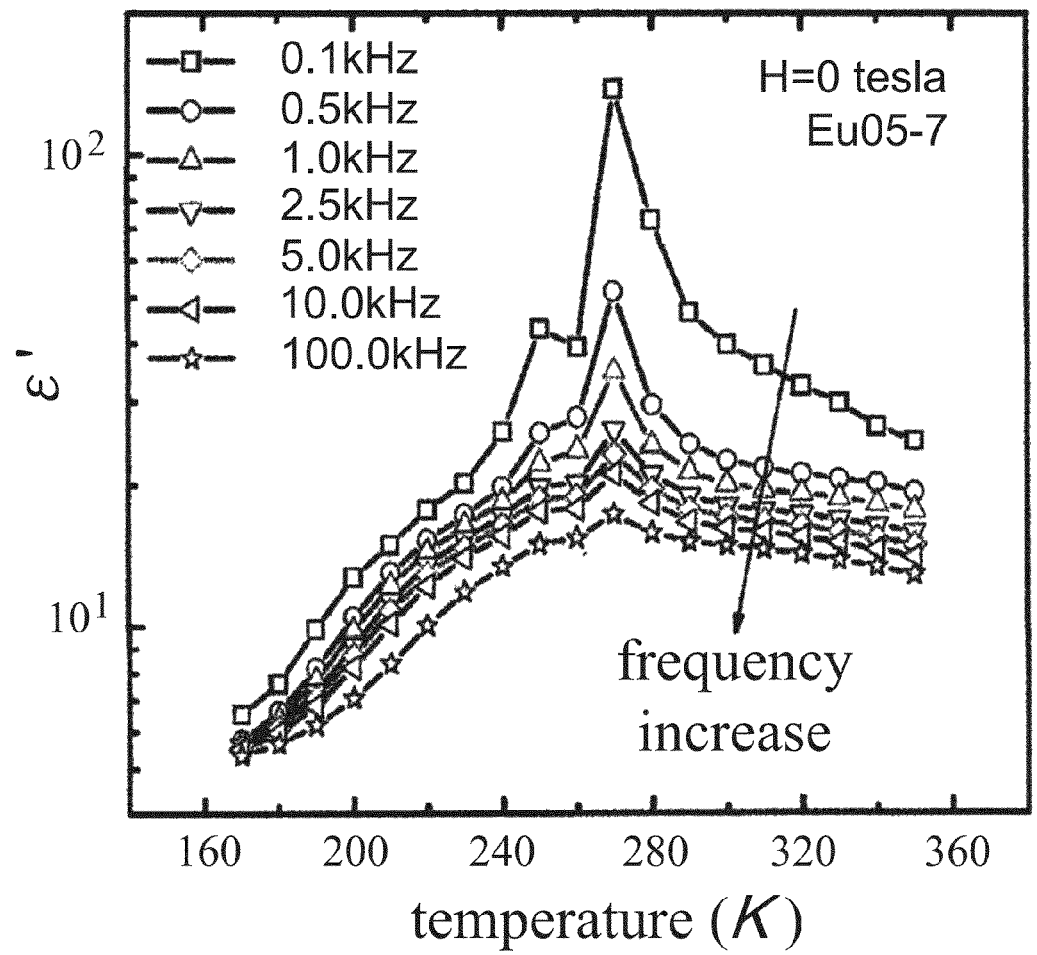
FIG. 3(e) is a relationship diagram of the dielectric value ($\in'$) and the absolute temperature (T) of the Eu05-8 sample at different frequencies according to the preferred embodiment of the present invention.

On the other hand, when the rare earth metal oxide-glass sample of the present invention is the Eu05-8 sample (i.e. a experimental sample with 0.5 mol % $Eu_2O_3$ prepared at a maximum calcination temperatures 800° C.) for experiments, referring now to FIG. 3(e), the temperature dependence of the real part of the relative dielectric constant (∈') of the Eu05-8 sample in absence of magnetic field at several frequencies (0.1 kHz to 100 kHz), logarithmically separated by one decade, is illustrated, wherein the shape of the curves has a well defined maximum dielectric value (∈'$_m$) at Tm about 270 K, and the frequency dependence indicates the phenomenon of dielectric relaxation. Similar to $Er_2O_3$, $Eu_2O_3$ has a diffuse phase transition (DPT) presence with high dielectric constant (∈'), quite different and much higher from pure bulk $Eu_2O_3$.

Figure 4A:
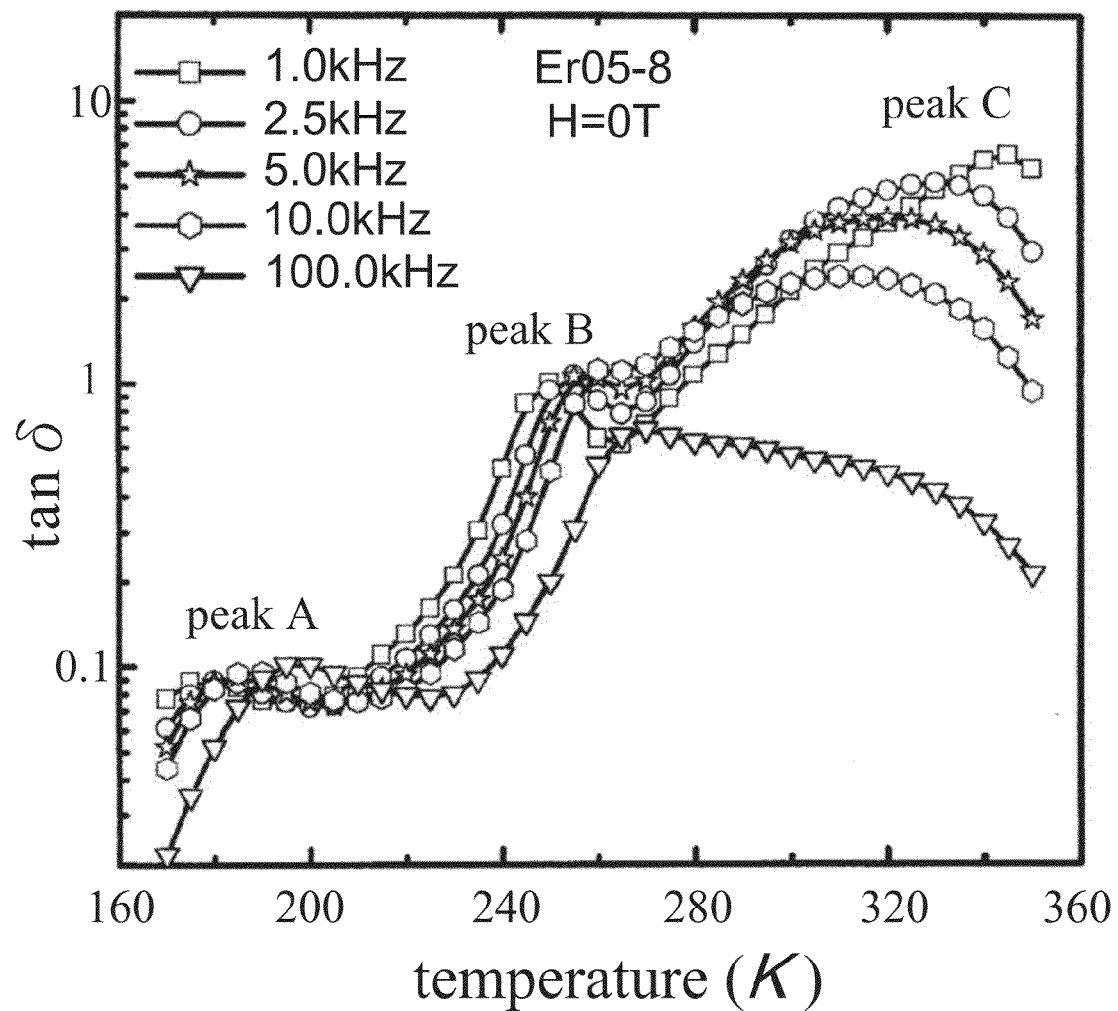
FIG. 4(a) is a curve diagram of the dielectric loss tangent tan δ of the Er05-8 sample at different frequencies according to the preferred embodiment of the present invention.

To understand the role of the relaxation dynamics, referring now to FIG. 4(a), the temperature dependence of the dielectric loss tangent (tan δ, i.e. leakage constant ratio, the ratio is 1 at room temperature) is shown for various frequencies. The main feature of tan δ is the two maximum peak values, wherein the peak A is at about 180 K, and the peak B is at about 260 K, wherein the leakage status of the peak B is very small) of tan δ which shift to higher temperatures as the frequency is increased. The peak intensity of the peak A is weaker (about 0.15) than that of the other peaks at high temperatures, while high dielectric leakage peak at elevated temperature peak (peak C>320 K) is shifted to lower temperature with increasing frequency. Thus, the loss-peak positions can be obtained from the frequency and temperature-dependent plot.

Figure 4B:
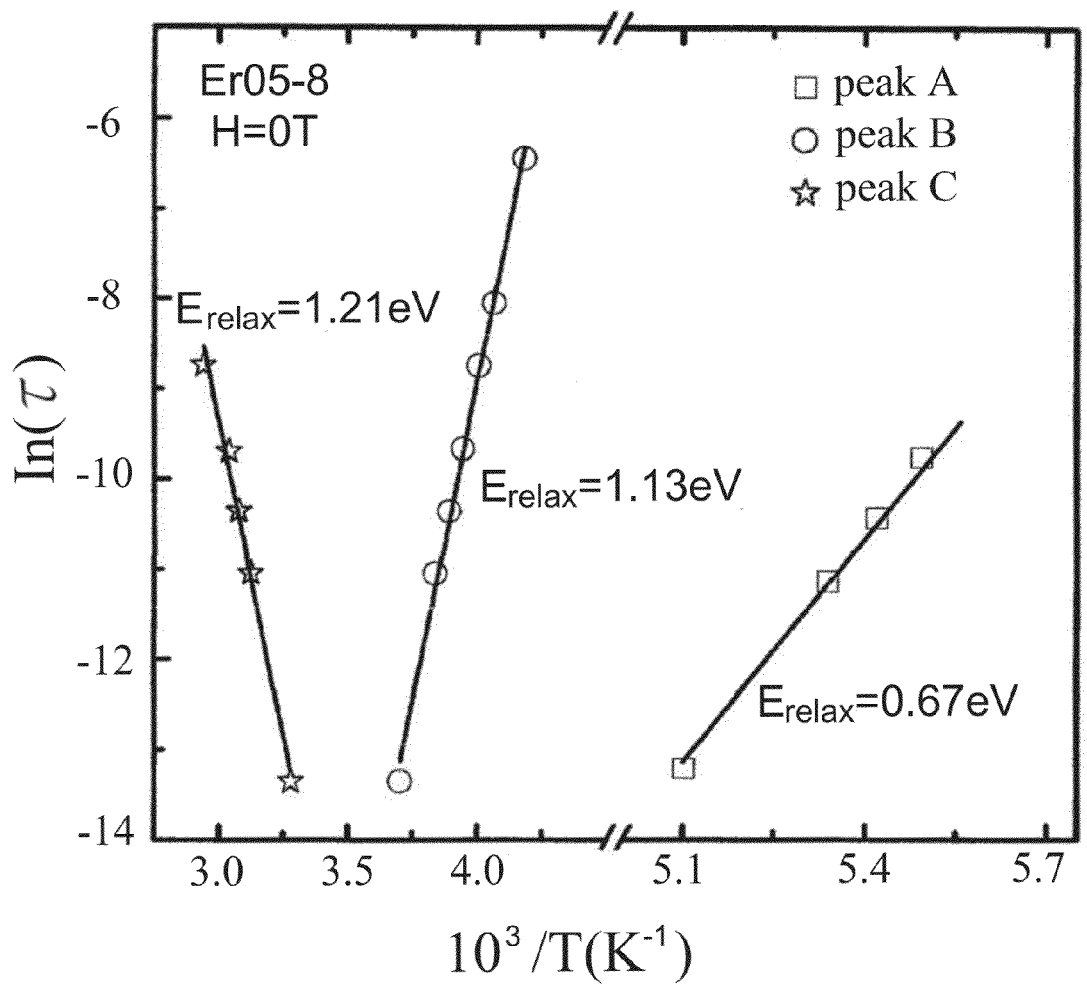
FIG. 4(b) is a curve diagram of the representative Arrhenius plot of the relaxation time of the Er05-8 sample according to the preferred embodiment of the present invention, wherein activation energy values (eV) in each peak values are illustrated.

Referring now to FIG. 4(b), the resulting temperature dependence (τ) is shown in an Arrhenius representation. Near the DPT temperature ($T_m$), thermally activated behavior with an energy barrier $E_{relax}$ of about 1.13 eV can be shown as the following equation: $τ=τ_o exp(E_{relax}/kT)$. However, above 300 K, the temperature dependence (τ) becomes reversed with activation energy 1.21 eV. Thus, it shows that dielectric relaxation process is closely associated with the presence of thermally activated oxygen vacancies. In the present invention, the dielectric constant relationship of the nanoparticle-glass system is also studied with different thickness of the samples and with different electrode materials, wherein dielectric constant changes are found to be within experimental errors indicating intrinsic nature of this system.

Figure 5:
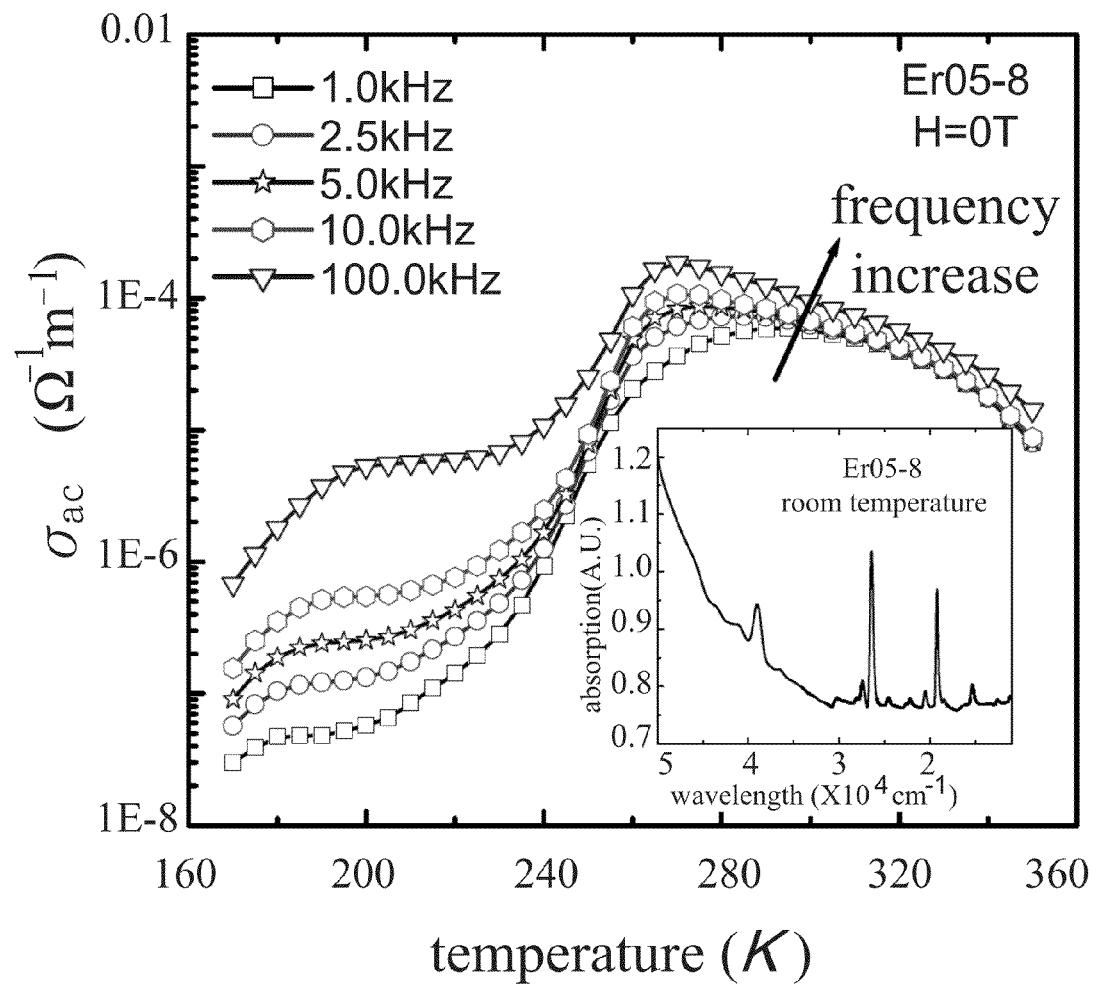
FIG. 5 is a curve diagram of temperature dependence of ac conductivity ($\sigma_{ac}$) of the Er05-8 sample at various frequencies according to the preferred embodiment of the present invention, wherein a lower right Inset figure is an optical absorption spectra of the Er05-8 sample at room temperature.

Referring now to FIG. 5, the real part of conductivity ($σ_{ac}$) of the complex ac conductivity (σ*) at various frequencies is illustrated. When $σ_{ac} ∝ ∈''×f$, the temperature dependence of σ'(T) is identical to that of the dielectric loss. At higher frequency dependence of conductivity (σ') can be described by the so-called universal dielectric response (UDR) with the addition of a dc conductivity, $σ_{ac}=σ_{dc}+σ_o f^s$ (where σdc=dc bulk conductivity; (σo=constant; and s=exponent). Relaxation features seen in ∈'(T) should be accompanied by peaks in σac(T) consisting of two temperature regions, shifting with frequency to the higher temperature.

The Maxwell-Wagnar (MW) effect or the interfacial phenomena model is usually adopted to explain the dielectric relaxation phenomena with high permittivity. This nano-glass composite system basically comprises a mixture of magnetic nanocrystalline $Er_2O_3$ grain separated by more insulating inter-grain ($SiO_2$ matrix). Such an increase in the dielectric constant with DPT behavior may be a signature of the effect of internal barrier layer capacitance (IBLC), which is directly proportional to the ratio of the grain size and the grain boundary thickness. Then, referring now to FIG. 6, the impedance data are analyzed using an equivalent circuit consisting of two parallel resistor-capacitor (RC) elements connected in series. One RC element ($R_g$ and $C_g$) corresponds to the more conductive region ($Er_2O_3$ nanoparticles) and the other RC element ($R_{gb}$ and $C_{gb}$) corresponds to the more resistive part ($SiO_2$ matrix) of the sample. Each of the RC elements generally gives rise to an arc in the complex impedance Z"-Z' plane. The impedance spectroscopic data are analyzed with the help of commercial software (Z-VIEW, version 2.9c). According to the popular technique of explaining impedance spectra in the complex Z"-Z' plane, the high frequency arc is related to the grain (intrinsic effect). At low temperature ($T_m$<270 K), almost the entire measured frequency region (20-2×10$^6$ Hz) is dominated to have the grain response, governed by the intrinsic effect.

Figure 6:
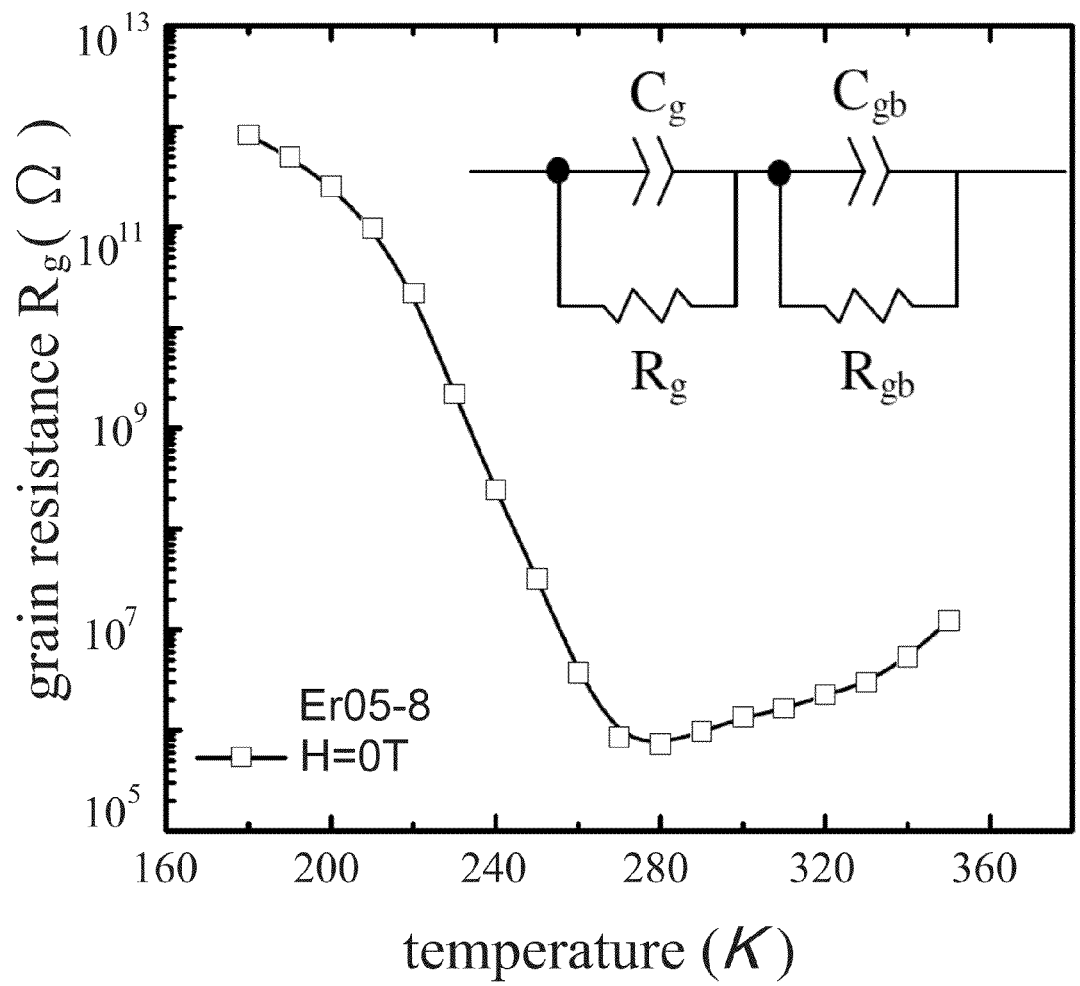
FIG. 6 is a curve diagram of temperature dependence of grain resistance ($R_g$) of erbium oxide calculated from an impedance complex plane plots according to the preferred embodiment of the present invention, wherein an upper right inset shows a schematic model of equivalent electrical circuits.

As shown in FIG. 6, it shows that the contribution of grain ($Er_2O_3$) resistance ($R_g$, values obtained from equivalent circuit model) of the Er05-8 sample is used as a function of measuring temperature, wherein $R_g$(T) reveals transition (about 270 K) coinciding with the Tm of ∈'(T) as well as a $σ_{ac}$. These experimental results imply that the nature of charge carries responsibility for dielectric relaxation peaks and dc conduction belongs to the same category, which indicates that the polarization relaxation has a close relation with the conductivity in grain interior, and the polarization process probably depends on the conducting of the charge in the grain interior.

Figure 7A:
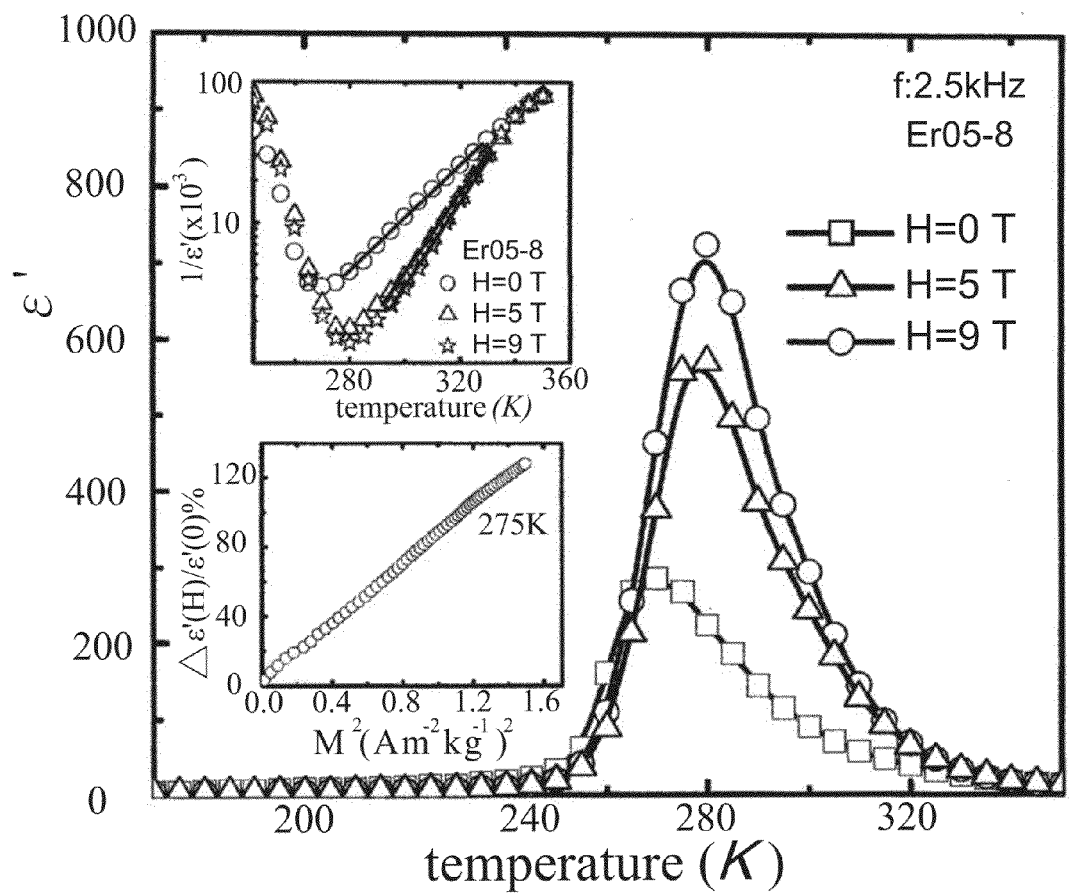
FIG. 7(a) is a curve diagram of dielectric value ($\in$') and the absolute temperature (T) of the Er05-8 sample measured under different applied magnetic fields at a fixed frequency (2.5 kHz) according to the preferred embodiment of the present invention, wherein an upper left inset figure is the variation of the inverse of dielectric value ($\in$') with temperature, exhibiting the Curie-Weiss behavior; and a lower left inset figure is the dielectric strength ($\Delta\in$'/$\in$') of the Er05-8 sample, showing linear variation with the square of magnetization ($M^2$), measured in the vicinity of $T_m$ (~275 K)

Referring now to FIG. 7(a), about the magnetodielectric (MD) effect, the present invention also shows large increase of dielectric value (∈') under an externally applied magnetic field for the Er05-8 nanoparticles. A large increase of dielectric value (∈') (about 2.75 times) under a magnetic field of 9 T observed around the transition temperature region 240-280 K at 2.5 kHz. As shown in upper left inset figure of FIG. 7(a), the field dependent inverse of dielectric constant with temperature is also found to fit the Curie-Weiss law with Curie constant (C) and Curie-Weiss temperature ($T_o$), as shown in Table 1. It should be noted that both of the dielectric peak temperatures $T_m$ and $T_o$ shift to higher temperature regions with increasing magnetic field. This indicates that magnetic spins ordering occurs at higher temperature under magnetic field, and thus spin-lattice coupling is reduced under magnetic field.

Figures 7B, 7C:
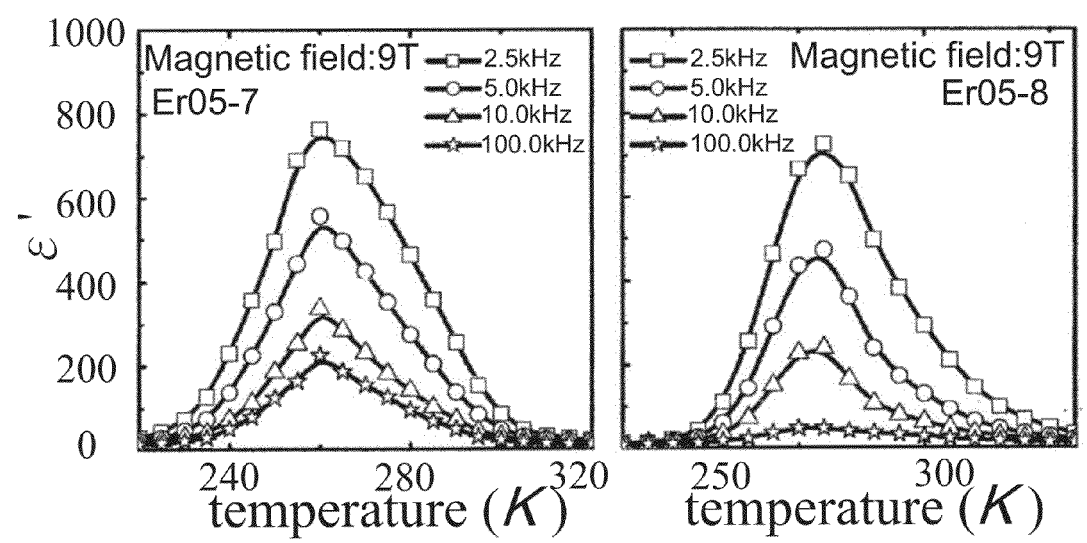
FIG. 7(b) is a curve diagram of dielectric value ($\in$') and the absolute temperature (T) of the Er05-7 sample measured under a 9T applied magnetic fields at various frequency (kHz) according to the preferred embodiment of the present invention.
FIG. 7(c) is a curve diagram of dielectric value ($\in$') and the absolute temperature (T) of the Er05-8 sample measured under a 9T applied magnetic fields at various frequency (kHz) according to the preferred embodiment of the present invention.

Referring now to FIGS. 7(b) and 7(c), temperature and frequency dependent dielectric constant is measured at a typical higher magnetic field (about 9 tesla) for two samples. It is observed that the dielectric value (∈') is larger in the lower temperature annealed samples (i.e. particle size dependent effect of (∈')). It is important to mention that the increase of nanocrystal size by long time annealing the glass system cause the above mentioned DPT as well as MD effect to decrease and ultimately disappear if the dielectric value (∈') reduced to that of the pure bulk crystalline $Er_2O_3$.

As shown in the lower left inset figure of FIG. 7(a), to further clarify the character of the MD effect, the field dependent magnetodielectric strength can be measured and defined by the following function of the square of the magnetization ($M^2$) near $T_m$ (about 275 K):

$$Δ∈'(H)/∈'(0)=[∈'(H)-∈'(0)]/∈'(0)$$

This behavior can also be calculated by the scaling function, as follows:

$$\frac{Δε'}{ε'} \approx αM^2$$

wherein α is about 0.782 and related to the magneto-electric interaction constant and magneto-striction effect. This measurement suggests that the dielectric properties of magnetic nanoparticles are closely related to the disposition of the magnetic moments in the sample system. Thus, in the present sample system, the MD effect is related to the super-paramagnetism, typical size and concentration of the nanoparticles of the guest oxide ($Er_2O_3$) and $SiO_2$ host glass.

Figure 8:
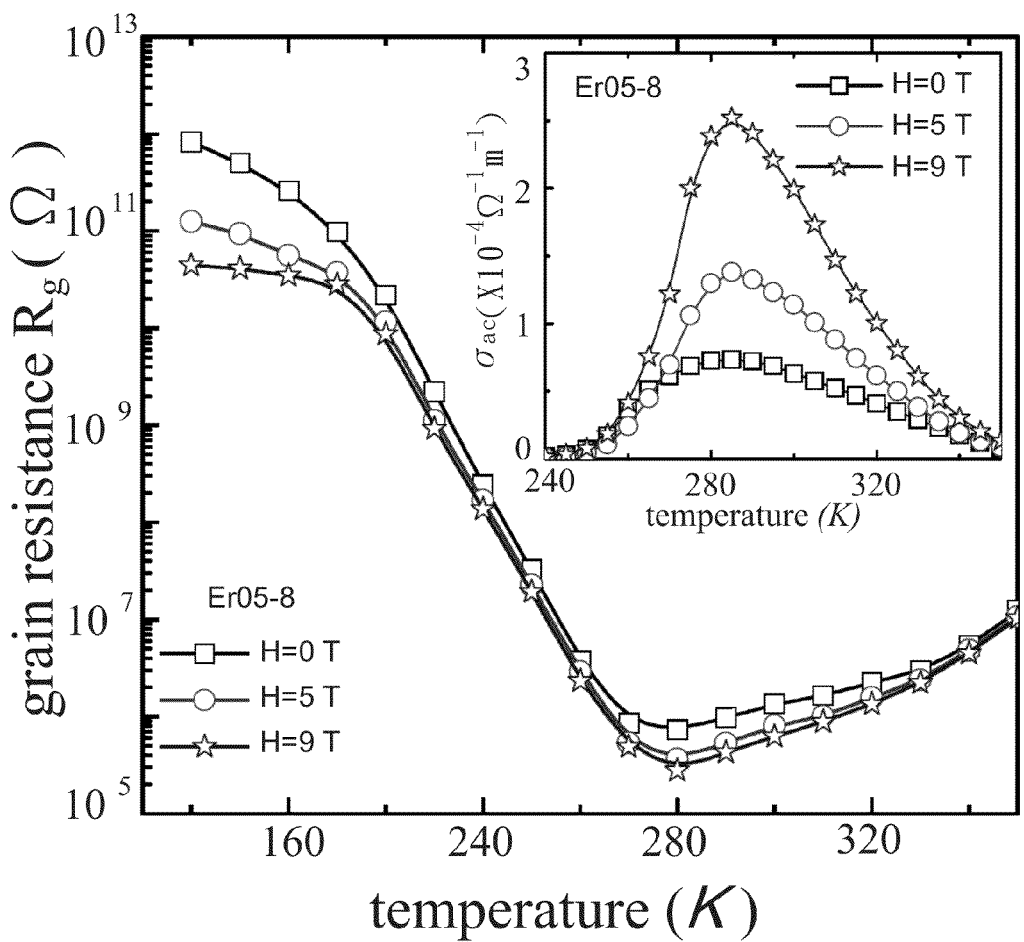
FIG. 8 is a curve diagram of temperature dependence of grain resistance ($R_g$) of erbium oxide calculated from an impedance complex plane plots with external magnetic field according to the preferred embodiment of the present invention, wherein an upper right inset figure is the temperature dependence of ac conductivity ($\sigma$ac) at a fixed frequency (2.5 kHz) with various externally applied magnetic fields.

Referring now to FIG. 8, the values for temperature dependent nanocrystalline $Er_2O_3$ resistance ($R_g$) is obtained from equivalent circuit element along with ac conductivity in presence of an externally applied magnetic field, wherein a huge remarkable magnetic-field influence feature is shown. A strong positive magnetoelectric interaction constant is observed, while the observed MD effect is caused essentially through the combination of magnetoresistance and Maxwell-Wagnar (MW) effect. When the nanocrystalline $Er_2O_3$ resistance decreases with the increase of externally applied magnetic field (i.e. negative magnetoresistance), the dielectric constant increases with the increase of the externally applied magnetic field (i.e. positive magnetodielectric effect). Enhancement of the MD effect through the resistance ratio might imply the possible tunability of the resistive MD effect. The nanocrystalline $Er_2O_3$:$SiO_2$ can be spontaneously (self-organized) formed with almost equal size and separation pitch in a natural way. It is intrinsic to the material, which could be modified by well-controlled nanoparticle size with separation pitch.

The foregoing observations demonstrate that the coupling between magnetic and dielectric properties of nanoparticles is apparently a general feature of the present invention. Moreover, the particle size, separation pitch and concentrations of the $Er_2O_3$ nanocrystals contributing to the magnetically and electrically responded permittivity are all easily controllable with annealing temperature and doping concentration. Furthermore, the MD effect and super-paramagnetic behavior of the present invention is distinguished from other systems showing MD behavior, and can be diminished with growth of nano-cluster size by long time annealing the glass. Besides, the dielectric response of the Er05-12 sample has no any DPT (along with magnetic field effect), although it is contained $Er_2O_3$ nano-grain (particle size >40 nm) separated by $SiO_2$ barrier. As the crystal size increases, the DPT behavior and the associated MD effect decreases, and ultimately dielectric constant become equal to be their pure bulk crystalline counterparts (without silica matrix). However, this finding cannot be classified by the aforementioned Maxwell-Wagner contribution.

In an alternative possibility, the conduction mechanism is closely related to the oxygen vacancies. Thermally activated reorientation of dipole moment via the vacancy jumping (i.e. the oxygen ion jumping through the oxygen vacancy) is suggested as the origin of the dielectric relaxation with activation energy (about 0.7-1.2 eV). In addition, the possibility of the contact between the electrodes and samples influencing the dielectric properties is excluded by using different thickness of the samples and with different electrode materials. Furthermore, with increase of cluster size of the glass sample obtained by higher calcination temperature in atmosphere, the DPT is gradually suppressed, and eventually disappears in the Er05-12 sample.

Returning to the dielectric relaxation in the $Er_2O_3$: $SiO_2$ nano-glass composite system, both of the Maxwell-Wagnar mechanism and the reorienting dipole-centre model can be used to explain the main features of colossal room-temperature magnetodielectric response. However, the present invention also has further studies and experiments with different rare earth metal oxide systems having different concentration to research the origin and application feasibility of the rich dielectric material.

As described above, according to the present invention, it can synthesize super-paramagnetic nanocrystalline $Er_2O_3$ particles in silica glass by a sol-gel method at calcination temperatures between 700° C. and 900° C., such as 700° C., 750° C., 800° C., 850° C. or 900° C., so as to prepare the composite dielectric material, wherein $Er_2O_3$ nano-crystals in larger sizes can be obtained with higher calcination temperatures. The features of the $Er_2O_3$: $SiO_2$ nanoparticles-glass composite system according to the present invention are listed, as follows:

(1) Strong magnetic field dependence in the dielectric constant of nanocrystalline phase pure $Er_2O_3$ at different temperature is observed.

(2) Such colossal MD behavior in this nanoparticles-glass composite system at near room temperature is observed in the context of the magnetic spin and the dipole coupling through the lattice, so that it is advantageous to develop magnetoresistance change effects associated with nanoparticle size and concentration.

(3) Conduction mechanism in this nanoparticles-glass composite system is closely related to the thermally activated oxygen vacancies, which can be controlled by annealing the nanoparticles-glass composite system in oxygen atmosphere.

Figure 9:
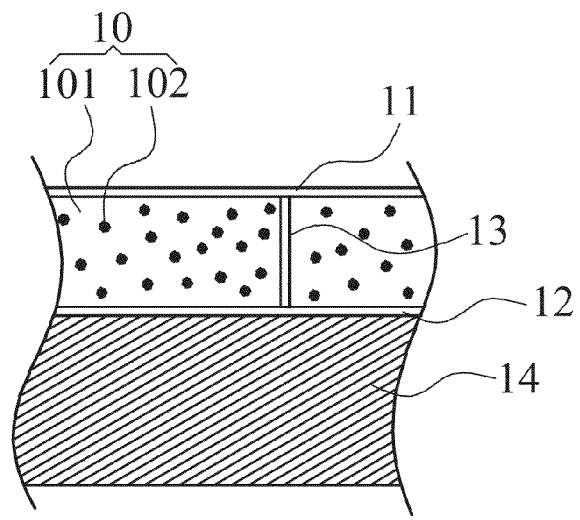
FIG. 9 is a schematic view of a glass composite system of erbium oxide and silicon dioxide nanoparticles applied to a dielectric layer of a semiconductor wafer according to the preferred embodiment of the present invention.

Based on the foregoing features, referring now to FIG. 9, the $Er_2O_3$:$SiO_2$ nanoparticles-glass composite system according to the present invention can be used as a composite dielectric material and suitably applied to a dielectric layer 10, wherein the dielectric layer 10 may be sandwiched between two electrode layers 11, 12. The matrix 101 of the dielectric layer 10 can be silicon dioxide ($SiO_2$). Furthermore, the matrix 101 is doped with the glass composite of nanoparticles 102 and silicon dioxide, wherein the nanoparticles 102 is preferably nanoparticles at least including rare earth metal oxide, such as erbium oxide $Er_2O_3$, europium oxide $Eu_2O_3$ or the mixture thereof, but the nanoparticles 102 may include other composition, such as other silicon dioxide different from the silicon dioxide of the matrix 101. The present invention can control the predetermined calcination temperature (ranged from 700° C. to 1000° C.) to suitably adjust the size (ranged from 2 nm to 10 nm) of the nanoparticles 102 for the purpose of providing a high dielectric value for the dielectric layer 10. Moreover, an electronic element 13 longitudinally passes through the dielectric layer 10 to electrically connect between the two electrode layers 11, 12, wherein the electronic element 13 is preferably a gate electrode of a transistor unit.

In one embodiment, the dielectric layer 10, the electrode layers 11, 12 and the electronic element 13 are all formed on an active surface of a wafer 14, wherein the wafer 14 is preferably a silicon wafer, and the stacked number of the dielectric layer 10, the electrode layers 11, 12 and the electronic element 13 can be one stack, two stacks or more, so as to construct surface circuit pattern structures on the wafer 14. After forming the dielectric layer 10, the electrode layers 11, 12, the electronic element 13 and other structural layers of integrated circuits (not-shown), a back surface of the wafer 14 is suitably ground to reduce the thickness thereof, and then suitably cut into a plurality of chips (not-shown).

In the present invention, the manufacturing method of the dielectric layer 10 uses a wet sol-gel process. For example, the wet sol-gel process may comprise the following steps of: mixing tetraethylorthosilicate (TEOS) and a precursor dopant (i.e. erbium chloride ($Er_2Cl_3$) with a dopant concentration of 0.5 mol %) into a silica gel; and processing the silica gel by calcination to reach a predetermined maximum calcination temperature ranged from 700° C. to 1000° C., so that the silica gel is converted into a glass composite of the rare earth metal oxide (i.e. erbium oxide ($Er_2O_3$)) and the silicon dioxide ($SiO_2$) to thus form a composite dielectric material having nanoparticles 102 of the rare earth metal oxide, wherein the composite dielectric material is applied to a surface of a semiconductor wafer 14 to form a thin layer (i.e. the dielectric layer 10) on the surface of the wafer 14, wherein the dielectric layer 10 comprises the glass composite of the rare earth metal oxide and the silicon dioxide of the composite dielectric material. The matrix 101 of the dielectric layer 10 is silicon dioxide which can be the silicon dioxide in the glass composite or other silicon dioxide come from another sol-gel process or other means. For example, in an alternative embodiment, the glass composite of the rare earth metal oxide and the silicon dioxide is further mixed with TEOS in another sol-gel process to obtain a mixture solution, and the mixture solution is applied onto the surface of the semiconductor wafer 14 by spin coating to form a silica gel layer which is then calcined by a similar calcination and melt if necessary, so as to form a dielectric layer 10 having the glass composite of the rare earth metal oxide and the silicon dioxide and the silica matrix.

On the other hand, according to other embodiments of the present invention, the erbium chloride ($Er_2Cl_3$) also can be replaced by europium chloride ($Eu_2Cl_3$) or other rare earth metal chloride, wherein the erbium oxide ($Er_2O_3$) is correspondingly replaced by europium oxide ($Eu_2O_3$) or other rare earth metal oxide. Except for erbium (Er) and europium (Eu), the rare earth metal used by the present invention also can be selected from lanthanum (La), cerium (Ce), praseodymium (Pr), neodymium (Nd), promethium (Pm), samarium (Sm), gadolinium (Gd), terbium (Tb), dysprosium (Dy), holmium (Ho), thulium (Tm), ytterbium (Yb), lutetium (Lu), scandium (Sc), yttrium (Y) or the combination thereof.

As described above, in comparison with the traditional high-k material which has magnetodielectric (MD) response but the reliability and stability thereof is still insufficient, the present invention as shown in FIG. 1 uses the sol-gel route to dope nanoparticles of rare earth oxides (such as erbium oxide $Er_2O_3$ or europium oxide $Eu_2O_3$) into $SiO_2$ glass matrix, so as to form a glass composite system used as composite dielectric material which is also applied to a dielectric layer of a semiconductor wafer. The composite dielectric material can show colossal dielectric response and magnetodielectric effect under an externally applied magnetic field, so that it can increase the dielectric coefficient of the dielectric layer of the semiconductor wafer and lower the leakage current and power consumption thereof. As a result, it is advantageous to develop a multifunctional integrated circuit which can normally operate at higher temperature.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A composite dielectric material doped with rare earth metal oxide, comprising:
 a matrix; and a plurality of nanoparticles, wherein the matrix comprises silicon dioxide, the nanoparticles comprise at least one type of rare earth metal oxide, and the particle diameter of the nanoparticles is ranged from 2 nm to 10 nm, wherein the nanoparticles are a glass composite of the rare earth metal oxide and silicon dioxide different from the silicon dioxide of the matrix.

2. The composite dielectric material doped with rare earth metal oxide according to claim 1, wherein the rare earth metal oxide is selected from erbium oxide, europium oxide or the mixture thereof.

\* \* \* \* \*